(12) United States Patent
Fornara

(10) Patent No.: US 10,991,664 B2
(45) Date of Patent: Apr. 27, 2021

(54) INTEGRATED FUSE

(71) Applicant: STMicroelectronics (Rousset) SAS, Rousset (FR)

(72) Inventor: Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/358,223

(22) Filed: Mar. 19, 2019

(65) Prior Publication Data

US 2019/0295965 A1    Sep. 26, 2019

(30) Foreign Application Priority Data

Mar. 21, 2018  (FR) ...................................... 1852417

(51) Int. Cl.
| H01L 23/62 | (2006.01) |
| H01H 85/02 | (2006.01) |
| H01L 23/525 | (2006.01) |
| H01L 21/66 | (2006.01) |

(52) U.S. Cl.
CPC ......... *H01L 23/62* (2013.01); *H01H 85/0241* (2013.01); *H01L 22/34* (2013.01); *H01L 23/5256* (2013.01); *H01H 2085/0283* (2013.01)

(58) Field of Classification Search
None
See application file for complete search history.

(56) References Cited

U.S. PATENT DOCUMENTS

| 2007/0120256 A1* | 5/2007 | Chen ................... H01L 23/5226 257/758 |
| 2010/0164053 A1* | 7/2010 | Furumiya ............... H01L 24/06 257/503 |
| 2013/0023091 A1* | 1/2013 | Leal ........................ H01L 24/05 438/132 |
| 2018/0190597 A1* | 7/2018 | Lu ........................ H01L 29/0623 |
| 2019/0107575 A1* | 4/2019 | Pagani ..................... H01L 22/32 |

FOREIGN PATENT DOCUMENTS

JP    2014017437 A    1/2014

OTHER PUBLICATIONS

INPI Search Report and Written Opinion for FR 1852417 dated Dec. 20, 2018 (8 pages).

* cited by examiner

*Primary Examiner* — Long Pham
(74) *Attorney, Agent, or Firm* — Crowe & Dunlevy

(57) ABSTRACT

A semiconductor wafer includes first zones containing integrated circuits, each first zone including a substrate and a sealing ring at a periphery of the substrate. The first zones are separated from each other by second zones defining cutting lines or paths. The integrated circuit includes an electrically conductive fuse that extends between a first location inside the integrated circuit and a second location situated outside the integrated circuit beyond one of the cutting lines. This electrically conductive fuse includes a portion that passes through the sealing ring and another portion that straddles the adjacent cutting line. The portion of the fuse that passes through is electrically isolated from the sealing ring and from the substrate. The straddling portion is configured to be sliced, when cutting the wafer along the cutting line, so as to cause the fuse to change from an electrical on state to an electrical off state.

10 Claims, 5 Drawing Sheets

US 10,991,664 B2

INTEGRATED FUSE

PRIORITY CLAIM

This application claims the priority benefit of French Application for Patent No. 1852417, filed on Mar. 21, 2018, the content of which is hereby incorporated by reference in its entirety to the maximum extent allowable by law.

TECHNICAL FIELD

Modes of implementation and embodiments relate to integrated circuits, and more particularly to fuses.

BACKGROUND

A fuse is conventionally a device that naturally has an electrical on or off state.

The fuse changes from its electrical on state to its electrical off state in the presence of a tripping event, and this change is irreversible, that is to say the fuse that has changed to its electrical off state is not able to return to its electrical on state.

There are numerous fuse structures.

There is a need to propose a new integrated fuse structure.

There is a need in particular to produce a fuse that makes it possible, for example during an electrical wafer sorting (EWS) phase of the functional integrated circuits before they are placed in a module, to perform operations by way of the fuse, for example signal transmissions or grounding operations, while at the same time maintaining the seal tightness of said integrated circuits that is ensured by one or more sealing rings.

SUMMARY

In an embodiment, a semiconductor wafer includes first zones containing integrated circuits each having a substrate and at least one sealing ring at the periphery of the substrate, the first zones being separated from one another by second zones containing cutting lines or paths. At least one integrated circuit of this wafer includes at least one electrically conductive fuse extending between a first location inside the integrated circuit and a second location situated outside the integrated circuit beyond one of the cutting lines adjacent to the integrated circuit, passing through said at least one sealing ring and straddling said adjacent cutting line.

The portion of the fuse that passes through is electrically isolated from said at least one sealing ring and from the substrate, the straddling portion is designed to be sliced, and the fuse being able to change from an electrical on state to an electrical off state upon slicing of the straddling portion caused by cutting the wafer along said adjacent cutting line.

The second location may be situated in a first zone beyond the cutting line and therefore beyond the second zone, and makes it possible to create a link between two adjacent integrated circuits.

The second location may also be situated in the second zone beyond the cutting line, so as, for example, to ground the fuse before it is sliced.

The portion of the fuse that passes through comprises a portion passing through said at least one sealing ring while at the same time being electrically isolated from said at least one sealing ring. This makes it possible not to alter the seal tight nature of each sealing ring that is present in the integrated circuit situated in the first zone.

According to one embodiment, the portion of the fuse that passes through is situated in a lower portion of said at least one sealing ring.

According to one embodiment, the portion of the fuse that passes through forms an integral part of said at least one sealing ring.

This makes it possible to bolster the seal tight nature of said at least one sealing ring.

According to one embodiment, the portion that passes through includes at least one polysilicon bar that is electrically isolated from the rest of said at least one sealing ring and from the substrate by a dielectric region.

According to one embodiment, the integrated circuit includes, above the substrate, an interconnect portion including several metallization levels, and said straddling portion of the fuse is situated at the same level as one of the metallization levels of the interconnect portion of said integrated circuit.

According to another aspect, what is also proposed is an integrated circuit including a substrate, at least one sealing ring at the periphery of the substrate and at least one electrically conductive element extending from a first location inside the integrated circuit to outside said at least one sealing ring and passing through said at least one sealing ring, the outer portion situated outside said at least one sealing ring having a free end, the portion of the conductive element that passes through being electrically isolated from said at least one sealing ring and from the substrate.

According to one embodiment, the portion of the conductive element that passes through is situated in a lower portion of said at least one sealing ring.

According to one embodiment, the portion of the conductive element that passes through forms an integral part of said at least one sealing ring.

According to one embodiment, the portion that passes through includes at least one polysilicon bar that is electrically isolated from the rest of said at least one sealing ring and from the substrate by a dielectric material.

According to one embodiment, the integrated circuit includes, above the substrate, an interconnect portion including several metallization levels, and said free end is situated at the same level as one of the metallization levels of the interconnect portion of the integrated circuit.

According to another aspect, what is also proposed is a method for manufacturing an integrated circuit, comprising: producing an initial integrated circuit on a first zone of a semiconductor wafer, said zone being separated from another first zone of this wafer by a second zone including a cutting line. The producing of the initial integrated circuit production includes: producing at least one sealing ring at the periphery of the substrate of the initial integrated circuit, and producing at least one electrically conductive fuse extending between a first location inside the initial integrated circuit and a second location situated outside the initial integrated circuit beyond said cutting line, passing through said at least one sealing ring and straddling said cutting line, the portion of the fuse that passes through being electrically isolated from said at least one sealing ring and from the substrate, the straddling portion being able to be sliced. The method further includes slicing said straddling portion when cutting the wafer along said cutting line, so as to obtain said integrated circuit.

According to one mode of implementation, producing said portion that passes through comprises forming at least one polysilicon bar separated from the substrate by a layer of dielectric material, and forming said at least one sealing ring comprises producing an electrically conductive wall straddling said at least one polysilicon bar while being separated by a dielectric region.

BRIEF DESCRIPTION OF THE DRAWINGS

Other advantages and features of the invention will become apparent on examining the detailed description of the wholly non-limiting modes of implementation and embodiments and the appended drawings, in which.

DETAILED DESCRIPTION

Figure 1:
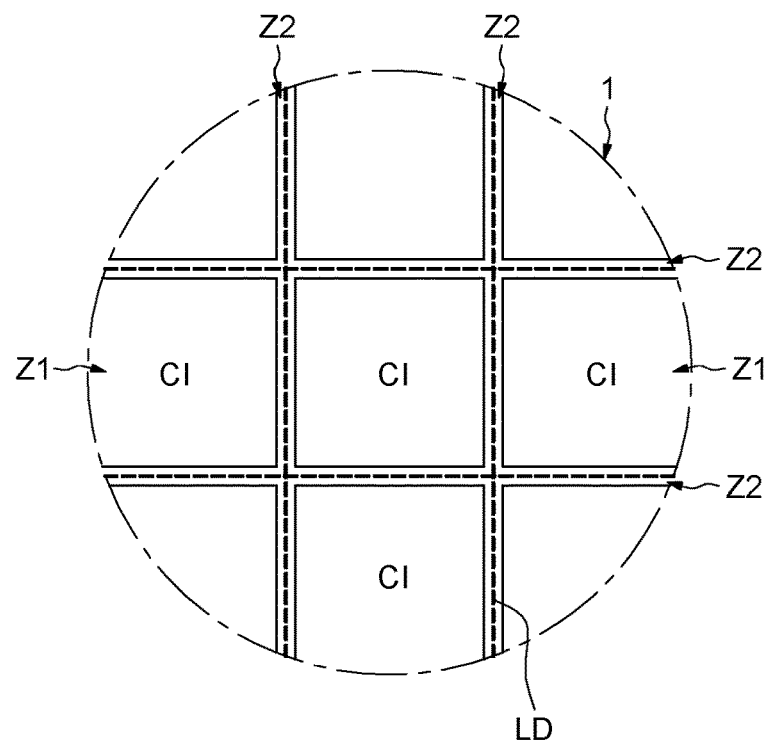
FIG. 1 shows a plan view of a semiconductor wafer.

FIG. 1 shows a plan view of a semiconductor wafer 1, advantageously made of silicon.

The wafer 1 includes first zones Z1 containing integrated circuits CI, and second zones Z2 containing cutting paths LD that make it possible to cut the wafer so as to individualize the integrated circuits CI.

The cutting operation is conventional and known per se.

Figure 2:
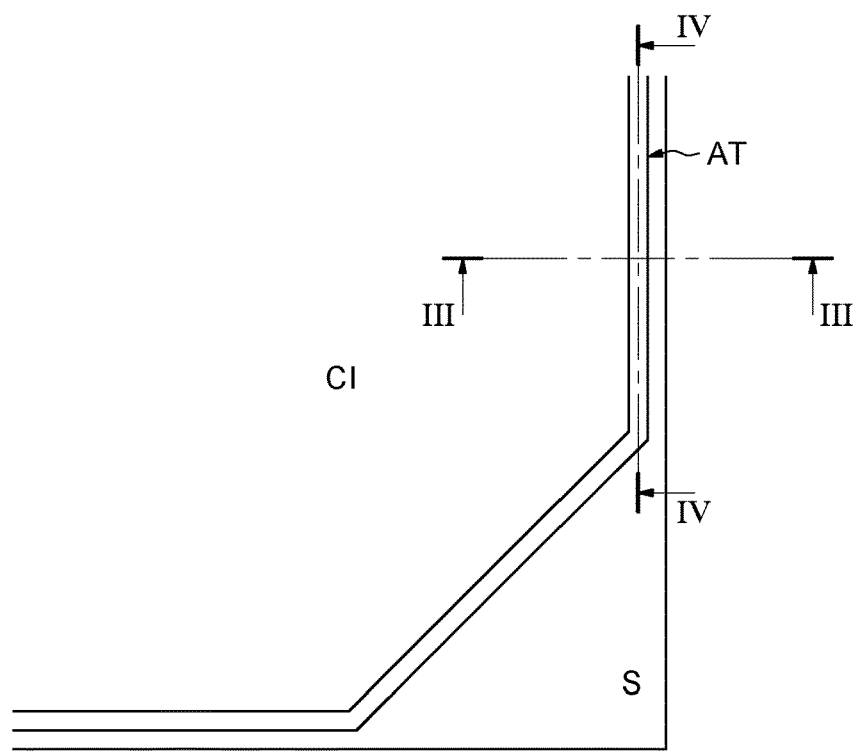
FIG. 2 shows a plan view of an exemplary integrated circuit before the wafer is cut.

FIG. 2 shows a plan view of an exemplary integrated circuit CI before the wafer is cut.

The integrated circuit CI produced in and on a semiconductor substrate S has a sealing ring AT on its outer periphery.

This presence is advantageous as it makes it possible to ensure seal tightness and therefore to protect the integrated circuit CI against the possible propagation of chips, splinters etc. during cutting. This sealing ring AT also forms an obstacle to the penetration of moisture into the interconnect portion (also known to those skilled in the art under the acronym BEOL for "back end of line") of the integrated circuit, this being particularly advantageous when this interconnect portion includes isolating regions having a low dielectric constant (i.e., a 'low K' material).

Of course, the integrated circuit CI may comprise several sealing rings AT on its periphery, these being positioned side-by-side so as to bolster seal tightness and thus better protect the integrated circuit CI.

Figure 3:
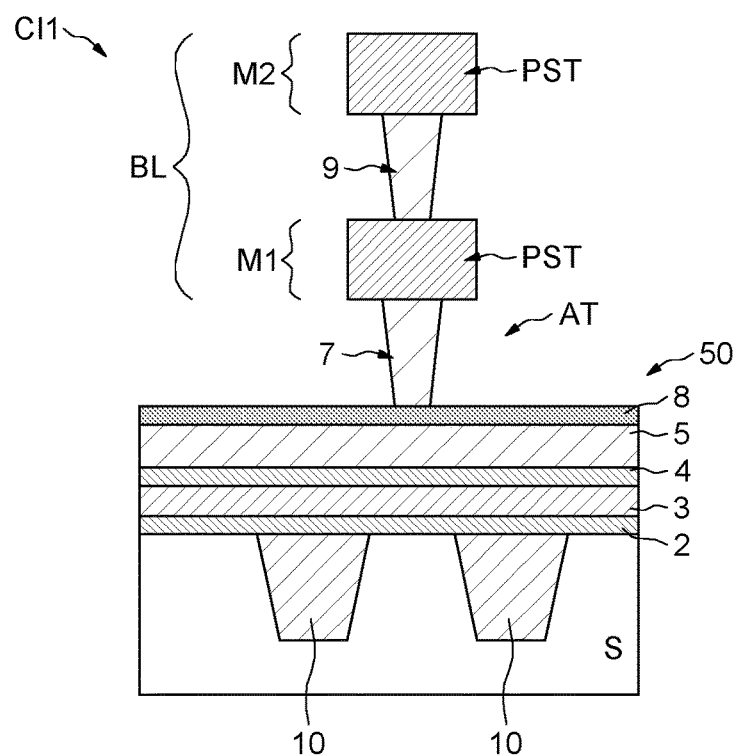
FIG. 3 shows a partial section of FIG. 2.

As illustrated in FIG. 3, which shows a partial section along the line of FIG. 2, the sealing ring AT comprises a contact 7 that forms a wall and a first metal track PST situated at the first metallization level M1 of an interconnect portion BL (BEOL) of the integrated circuit CI1.

On this same metal track PST that is situated at the first metallization level1, there rests a via wall 9 surmounted by a second metal track PST that is situated at the second metallization level M2 of the interconnect portion BL.

Of course, the sealing ring AT may include several metal tracks PST each situated at a metallization level that is linked to another metallization level of lower level by way of a via wall.

The sealing ring bears on a first polysilicon bar 5 by way of a metal silicide layer 8, where the polysilicon bar is itself on a first dielectric layer 4, for example a silicon oxide layer or an oxide-nitride-oxide layer, known to those skilled in the art under the acronym ONO.

The dielectric layer 4 separates the first polysilicon bar 5 from a second polysilicon bar 3 that is itself separated from the semiconductor substrate S by a second dielectric layer 2, for example a silicon oxide layer or an oxide-nitride-oxide layer.

As will be seen in greater detail hereinafter, this stack of polysilicon bars and oxide layers both forms a lower portion 50 forming an integral part of the sealing ring and includes a portion of a fuse that passes through. This portion that passes through, formed in this case by the bar 3, is electrically isolated from the substrate S by the oxide layer 2, and electrically isolated from the rest of the sealing ring by the oxide layer 4.

The substrate S comprises isolating regions 10, for example shallow trench isolations (STI), or a local oxide (LOCOS for local oxidation of silicon).

Figure 4:
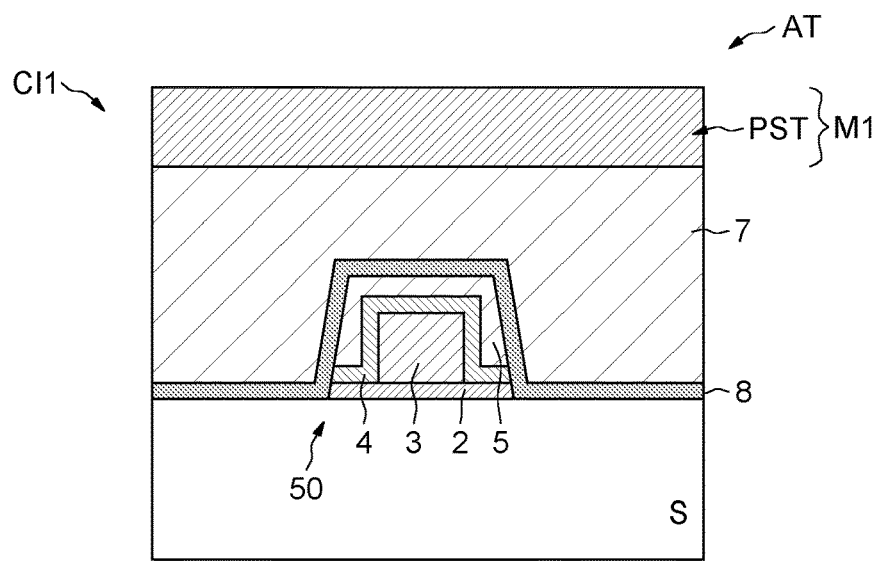
FIG. 4 shows a partial section of FIG. 2.

FIG. 4 shows a partial section along the line IV-IV of FIG. 2.

In this figure, it is seen that the lower portion 50 passes through the contact wall 7 extending to the periphery of the integrated circuit. This lower portion 50 is thus surrounded by this wall 7.

In the example described here, the lower portion 50 includes two polysilicon bars. In this exemplary embodiment, this results from the manufacturing, in the integrated circuit, of dual-gate transistors requiring the formation of two polysilicon layers.

That being said, the lower portion 50 of said sealing ring AT could include just a single polysilicon bar, for example the second polysilicon bar 3 isolated from the substrate S by a dielectric layer, for example the second dielectric layer 2.

In this case, this bar 3 would be isolated from the contact wall 7 by the first dielectric layer 4. This bar would then constitute the portion of the fuse that passes through and that is electrically isolated from the substrate S and from the rest of the sealing ring AT.

Figure 5:
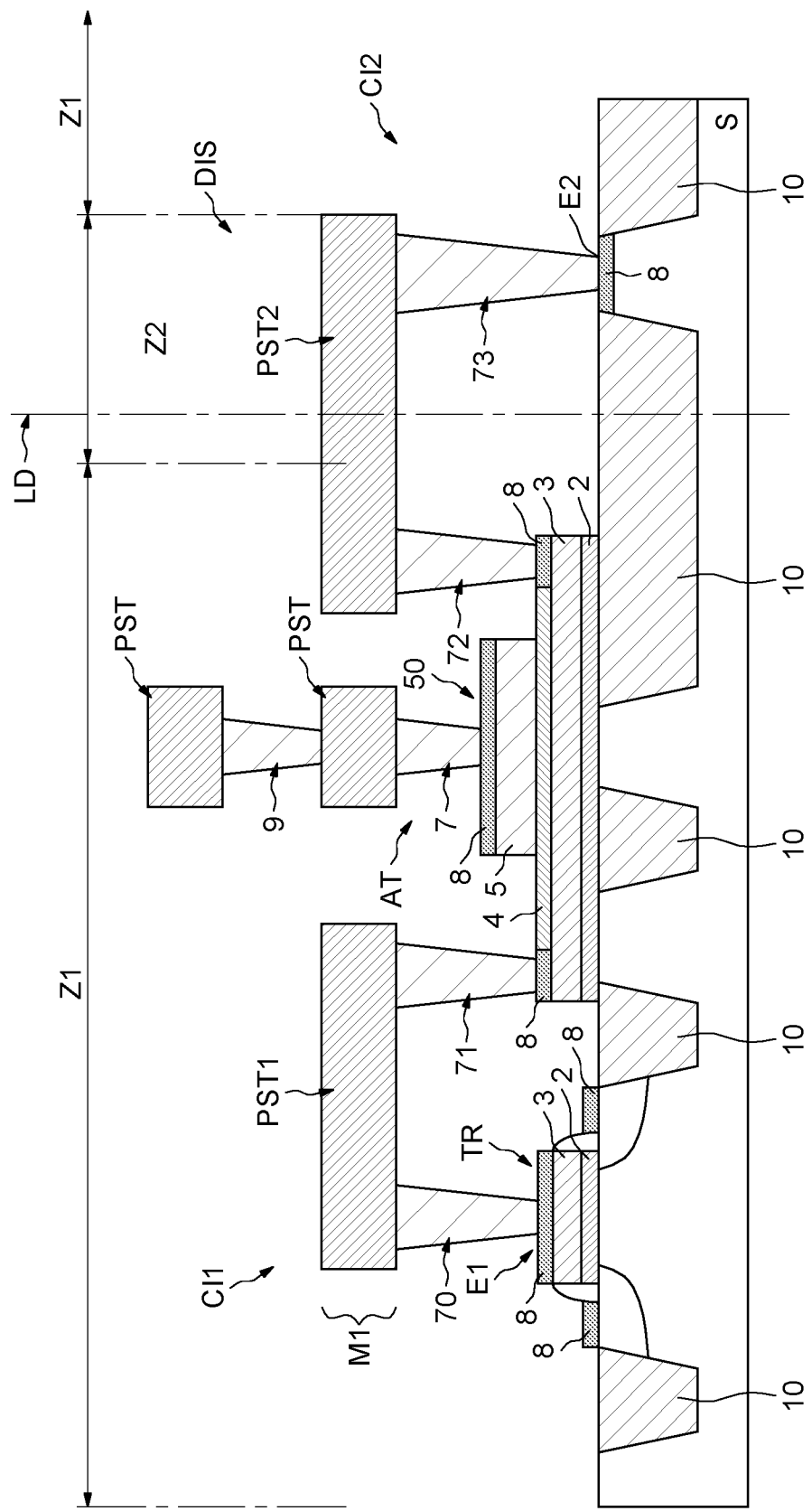
FIG. 5 shows a first integrated circuit and a second integrated circuit separated by a zone comprising a cutting path.

FIG. 5 shows a first integrated circuit CI1 situated in a first zone Z1 and separated from a second zone Z1 containing a second integrated circuit CI by a zone Z2 comprising a cutting path LD.

The circuit CI1 comprises a sealing ring AT whose structure has been described in FIG. 3 and that includes the lower portion 50.

The integrated circuit CI1 furthermore includes an electrically conductive fuse DIS that extends between a first location E1 inside the integrated circuit CI1 and a second location E2 situated outside the integrated circuit CI1, in this case a location of the substrate of the wafer that is situated in zone E2 beyond the cutting line LD.

The first location E1, in this non-limiting example, is the gate of a transistor TR on which a silicide layer 8 is deposited and that comprises, on its active zones, metal silicide layers 8.

The fuse DIS comprises the polysilicon bar 3, which in this case forms the part 3 of the fuse DIS that passes through.

The part 3 of the fuse DIS that passes through is electrically isolated from the substrate S by the second dielectric layer 2, and from the sealing ring AT by the first dielectric layer 4.

The fuse DIS also comprises a straddling portion PST2 that will straddle said cutting line LD.

The straddling portion PST2 is linked to the second location E2 by a contact 73 that is positioned on a first metal silicide layer 8. The straddling portion PST2 is linked to the portion 3 that passes through by the contact 72 that is positioned on a second metal silicide layer 8.

The first location E1 is coupled to the portion 3 that passes through by contacts 70 and 71 and by a metal track PST1 that is situated at the first metallization level Ml.

It is seen in this example that the straddling portion PST2 is also situated at the first metallization level M1.

Of course, it would be possible for it to extend to a higher metallization level.

The second location E2 thus connected to the substrate S by the first metal silicide layer 8 makes it possible, if the substrate S is kept grounded, to keep the first location of the integrated circuit CI1 grounded.

When the fuse DIS links adjacent integrated circuits CI1 and CI2, it also makes it possible to perform operations, for example signal transmissions, between integrated circuits while at the same time maintaining the seal tightness of said integrated circuits.

The fuse DIS therefore advantageously makes it possible to perform, for example during an electrical wafer sorting (EWS) phase of the functional integrated circuits, operations by way of the fuse DIS, for example signal transmissions or grounding operations, while at the same time maintaining the seal tightness of these integrated circuits.

Figure 6:
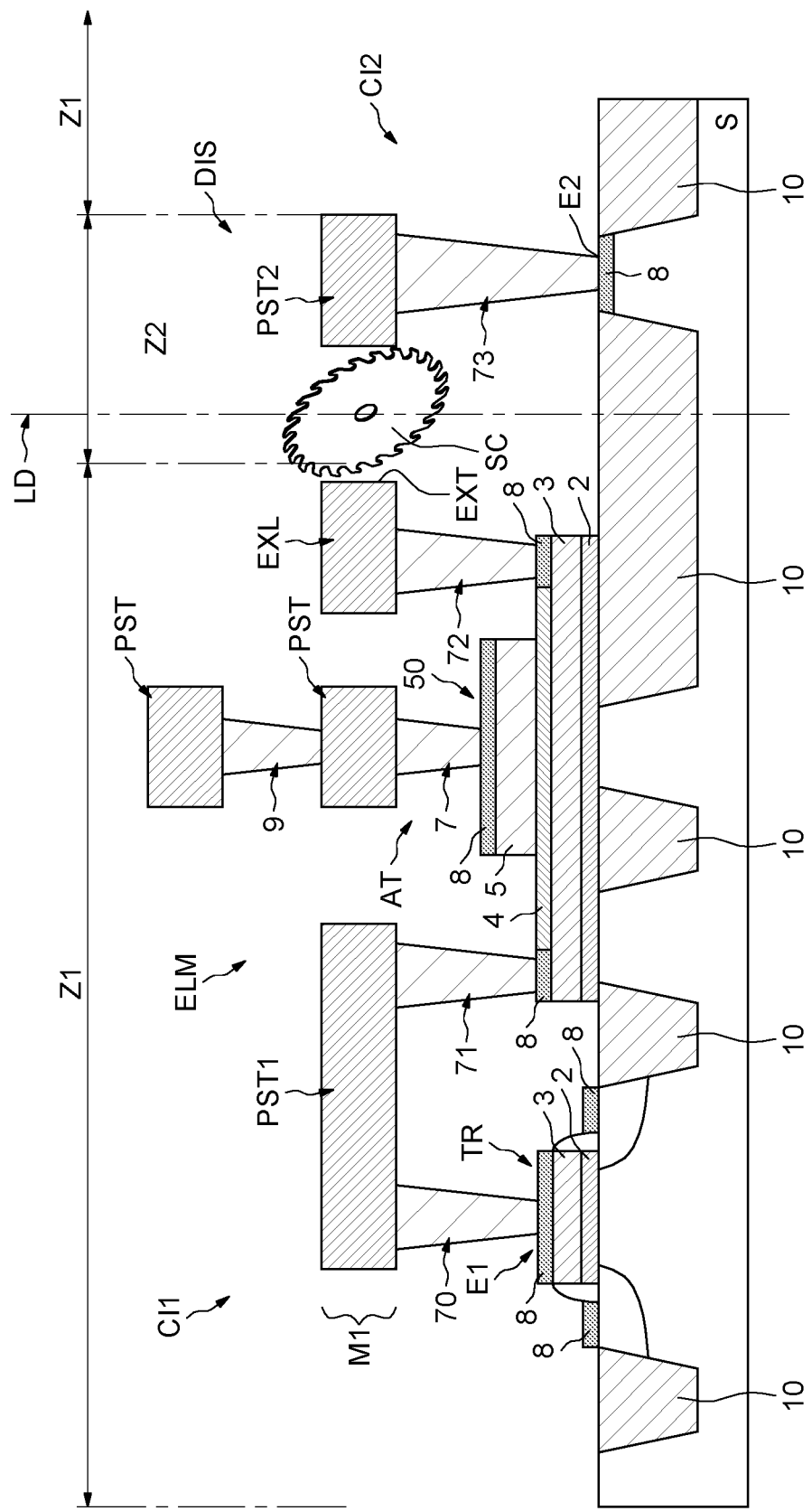
FIG. 6 shows the first integrated circuit and the second integrated circuit following slicing at the cutting path.

FIG. 6 illustrates the first integrated circuit CI1 and the second integrated circuit CI2 following slicing of the straddling portion PST2 of the fuse DIS straddling the cutting path LD by way of a saw SC.

Once it has been individualized, the integrated circuit CI1 comprises the sealing ring AT located at the periphery of the substrate S and an electrically conductive element ELM that corresponds to the fuse DIS, the straddling portion PST2 of which has been sliced.

Said conductive element ELM extends from the first location E1 inside the integrated circuit CI1 to outside said sealing ring AT.

It also comprises an outer portion EXL situated outside the sealing ring AT and comprising a free end EXT. This outer portion corresponds to the rest of the sliced straddling portion PST2.

The part 3 of the conductive element ELM that passes through is electrically isolated from the substrate S by the second dielectric layer 2, and is electrically isolated from the sealing ring AT by the first dielectric layer 4.

Figure 7:
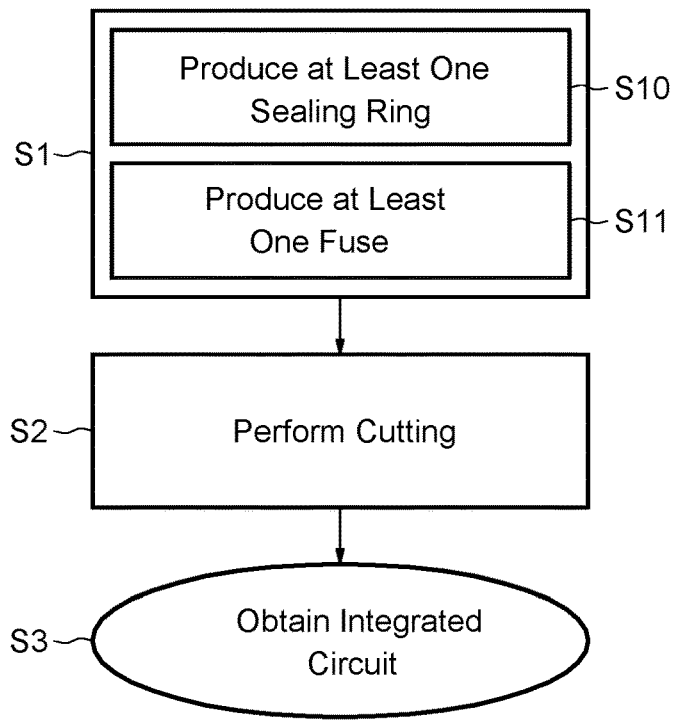
FIG. 7 schematically illustrates a manufacturing method.

FIG. 7 schematically illustrates one mode of implementation of a manufacturing method.

A first step S1 comprises producing an initial circuit CI.

To this end, in a step S10, at least one sealing ring AT, having, for example, a structure similar to that described in FIG. 3, is produced. Next, in a step S11, at least one fuse DIS, having, for example, a structure similar to that described in FIG. 5, is produced.

Once these operations have been performed, in step S2, cutting is performed along the cutting path LD of the wafer 1, thereby making it possible to cut the wafer 1 so as to individualize the initial integrated circuit.

The cutting leads to slicing of the straddling portion PST2 of the fuse.

An integrated circuit CI1 is thus obtained that is completely separate from the other integrated circuits of the semiconductor wafer 1 and that has a sealing ring AT that is integral with a conductive element ELM, for example structurally similar to that of FIG. 6 and protruding outside the sealing ring.

Figure 8:
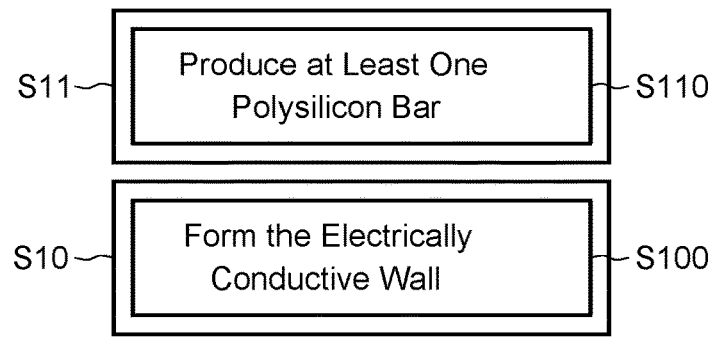
FIG. 8 shows production of at least one fuse using at least one polysilicon bar.

As illustrated in FIG. 8, to produce said at least one fuse DIS, in a step S110, it is possible to produce at least one polysilicon bar, in this case the polysilicon bar 3 separated from the semiconductor substrate S by the second dielectric layer 2, and the polysilicon bar 5 separated from the polysilicon bar 3 by the first dielectric layer 4.

Producing said at least one sealing ring AT comprises, in a step S100, forming the electrically conductive wall 7 around the lower portion 50.

These production operations involve conventional steps that are used in the manufacture of integrated circuits, such as deposition, etching, annealing, etc. operations.

The invention claimed is:

1. A semiconductor wafer, comprising:
   first zones containing integrated circuits, said first zones each having a substrate and at least one sealing ring at a periphery of the substrate, said at least one sealing ring formed at least in part by a conductive contact wall;
   wherein the first zones are separated from each other by second zones defining cutting lines between first zones;
   wherein at least one integrated circuit includes:
      at least one electrically conductive fuse extending between a first location inside the integrated circuit and a second location situated outside the integrated circuit beyond one of the cutting lines adjacent to the integrated circuit, the at least one electrically conductive fuse passing through an opening in a bottom of the conductive contact wall of said at least one sealing ring and straddling said adjacent cutting line;
      wherein a portion of the at least one electrically conductive fuse that passes through the opening in the bottom of the conductive contact wall of said at least one sealing ring is electrically isolated from said conductive contact wall of at least one sealing ring and from the substrate;
      wherein a portion of the fuse straddling said adjacent cutting line is configured to be sliced, said at least one electrically conductive fuse changing from an electrical on state to an electrical off state upon slicing of the straddling portion caused by cutting along said adjacent cutting line.

2. The wafer according to claim 1, further comprising a silicide layer which extends between the portion of the at least one electrically conductive fuse that passes through the opening and the bottom of the conductive contact wall, said silicide layer extending further between the bottom of the conductive contact wall and the substrate.

3. The wafer according to claim 2, wherein the portion of the at least one electrically conductive fuse that passes through said opening in the bottom of the conductive contact wall comprises a first polysilicon bar, and further comprising a second polysilicon bar insulated from the first polysilicon bar, and wherein said silicide layer is formed on said second polysilicon bar.

4. The wafer according to claim 3, wherein said portion that passes through said at least one sealing ring includes at least one polysilicon bar that is electrically isolated by a dielectric region from a rest of said at least one sealing ring and from the substrate.

5. The wafer according to claim 1, wherein the integrated circuit includes, above the substrate, an interconnect portion including several metallization levels, and said straddling portion of the at least one electrically conductive fuse is situated at the same level as one of the metallization levels of the interconnect portion of said integrated circuit.

6. A semiconductor wafer, comprising:
   first substrate zones of a semiconductor substrate containing integrated circuits;

an electrically conductive sealing ring structure at a periphery of each first substrate zone;

second substrate zones of the semiconductor substrate defining cutting lines between first substrate zones;

an electrically conductive fuse extending from one of the first substrate zones to one of the second substrate zones located adjacent to said one of the first substrate zones, said electrically conductive fuse passing through an opening in a bottom of the electrically conductive sealing ring structure;

wherein a portion of the electrically conductive fuse that passes through the opening in the bottom of the electrically conductive sealing ring structure is electrically isolated from electrically conductive sealing ring structure and from the semiconductor substrate; and wherein a portion of the electrically conductive fuse which straddles the cutting line of said one of the second substrate zones is configured to be sliced, said fuse changing from an electrical on state to an electrical off state upon slicing of the portion which straddles caused by cutting along said cutting line.

7. The wafer according to claim 6, further comprising a silicide layer which extends between the portion of the electrically conductive fuse that passes through the opening and the bottom of the electrically conductive sealing ring structure, said silicide layer extending further between the bottom of the electrically conductive sealing ring structure and the substrate.

8. The wafer according to claim 6, wherein the portion of the electrically conductive fuse that passes through said opening in the bottom of the electrically conductive sealing ring structure comprises a first polysilicon bar, and further comprising a second polysilicon bar insulated from the first polysilicon bar, and wherein said silicide layer is formed on said second polysilicon bar.

9. The wafer according to claim 6, wherein said portion of the electrically conductive fuse that passes through said opening in the bottom of the electrically conductive sealing ring structure includes at least one polysilicon bar that is electrically isolated by a dielectric region from a rest of said electrically conductive sealing ring structure and from the substrate.

10. The wafer according to claim 6, further comprising, at the first substrate zones, an interconnect portion over the semiconductor substrate that include several metallization levels, and wherein said portion of the electrically conductive fuse which straddles the cutting line is situated at a same level as one metallization level of the interconnect portion.

* * * * *

UNITED STATES PATENT AND TRADEMARK OFFICE
CERTIFICATE OF CORRECTION

PATENT NO. : 10,991,664 B2
APPLICATION NO. : 16/358223
DATED : April 27, 2021
INVENTOR(S) : Pascal Fornara It is certified that error appears in the above-identified patent and that said Letters Patent is hereby corrected as shown below:

In the Specification

At Column 3, Line 59, please replace the term [[ level 1 ]] with -- level M1 --.

At Column 4, Line 42, please replace the term [[ CI ]] with -- CI2 --.

Signed and Sealed this
Fifteenth Day of August, 2023

Katherine Kelly Vidal
*Director of the United States Patent and Trademark Office*